PRINTED CIRCUIT BOARD CONNECTOR

Filed Feb. 9, 1962

INVENTOR.
DAVID H. JAMES
BY
Mead, Browne, Schuyler & Beveridge
ATTORNEYS.

United States Patent Office 3,173,732
Patented Mar. 16, 1965

3,173,732

PRINTED CIRCUIT BOARD CONNECTOR

David H. James, Huntsville, Ala., assignor to The Brown Engineering Company, Inc., Huntsville, Ala., a corporation of Alabama Filed Feb. 9, 1962, Ser. No. 172,264
13 Claims. (Cl. 339—17)

This invention relates generally to connectors for interconnecting two or more printed circuit boards in a composite circuit where space and the need for interchangeability do not admit soldered connections. It relates particularly to an assembly of interchangeable spring contacts and connector blocks of general applicability for interconnecting a pair or more of circuit boards in different configurations, supplied in each case with a row of terminal strips along the edge of the board, which circuit boards are to be interconnected to form a composite circuit, sometimes referred to as modular construction.

Since the development of printed circuit techniques or circuitry mounted on a panel or board having printed or surface-imbedded interconnecting circuitry, it has been desirable to provide for interconnectors between such panels and from the circuitry of each panel to associated apparatus. Several types of terminal strip for this purpose have been devised, each of which has its known disadvantages, generally requiring considerably more space than is desirable. Devices of this sort have generally permitted interconnection of such rigid boards only in particular ways, such as to limit their usefulness. Such devices have merely permitted the insertion of such a board into a slot which then makes connections to some other apparatus or to auxiliary circuitry. In any such interconnecting device, whether for rigid circuitry boards or for flexible plastic cables having conducting circuits parallel-arranged along the length thereof and terminating in a row of transfer terminals, a prime requisite of the interconnecting terminal strip is small size and lightness of weight to a degree heretofore not realized.

It is, accordingly, an object of this invention to provide a small connector terminal strip of light weight and general applicability.

Another object of the invention is to provide a terminal strip for the interconnection of two circuit boards or cables such as to secure the boards in a parallel array, either with one turned back upon the other, or with the two in substantial linear extension of each other.

A further object of the invention is to provide a connector in which two circuit boards may be interconnected at right angles.

Still a further object of the invention is to provide a connector in which three terminal boards may be arrayed, two in parallel and a third at right angles thereto.

A still further object of the invention is to provide an assembly of terminal strips for the interconnection of a considerable number of terminal boards spaced closely to each other for the compact assembly of a group of circuit boards.

Yet another object of the invention is to provide a universal block adaptable to receive a variety of contact spring elements for the interconnection of two or more circuit boards, each contacting element of a connector being selectable to interconnect contacts on any two of three circuit boards on the same block.

Other objects and advantages of this invention will be more clearly understood as the description proceeds in connection with the drawings, in which.

Figure 1:
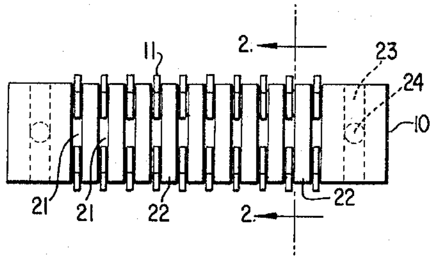
FIG. 1 is a front elevation of a form of the connector adapted to receive circuit boards on upper and lower surfaces thereof.

As illustrated, the connector of this invention may comprise a series of spring contacts within an insulating body or block 10 which is molded or otherwise formed of a plastic material, for example, diallyl phthalate preferably including reinforcing fibers.

The plastic material selected is of good insulation quality and of low moisture absorption, as well as of good surface characteristics such that moisture has little or no effect upon the insulation value of the plastic block. The insulating block 10 may be of any convenient length to accommodate a number of contacting spring elements 11, each formed generally in U-shape with inwardly turned ends 13, to substantially encircle the block 10. Alternatively, the spring element may be of the form shown at 12, also of U-shape with inwardly turned ends 14 enclosing substantially three-quarters of the block 10.

In order to provide a universal insulating block for many purposes, a substantially square cross-section is illustrated in FIGS. 2, 3, 5 and 6, adapted to receive either contact springs 11 or 12. The form of block may be square or rectangular, the latter form being illustrated at 15 in FIGS. 7 and 8, in which one dimension has been reduced in order to provide for closer spacing of the terminal boards to be interconnected thereby.

Figure 4:
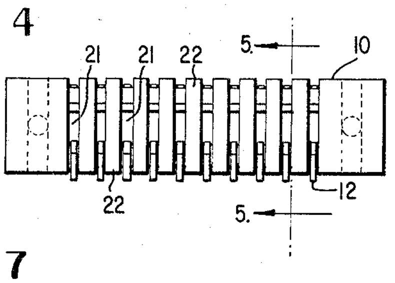
FIG. 4 shows a front elevation of the connector of FIG. 1 having a different form of spring contact elements attached thereto.

The insulating block is provided with cut or formed channels extending substantially therearound, each of sufficient depth to receive a spring element 11 or 12, and to permit its flexure therein without extending beyond the surface 16, 17, 18 or 19 thereof. Such grooves or channels are illustrated at 21 in FIGS. 1 and 4, and are separated by lands 22 forming continuations of the surfaces 16, 17, 18 and 19 of the block 10. To provide for the assembling of terminal boards upon the faces of the block, screw holes such as 23, preferably threaded, are formed at the ends or at suitable intervals along the length of the block to permit clamping of terminal boards thereto. A second threaded hole 24 is illustrated in the figures for the attachment of a terminal board at right angles to that secured at bores 23. Either the bores 23 or 24 may alternatively be employed for securing the terminal block or connector to a suitable mounting, whereby the terminal board itself may be supported.

Figure 3:
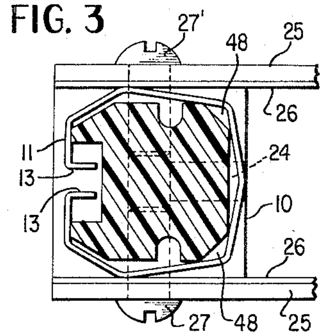
FIG. 3 shows two terminal boards attached to opposite sides respectively of the connector of FIG. 1.
Figure 7:
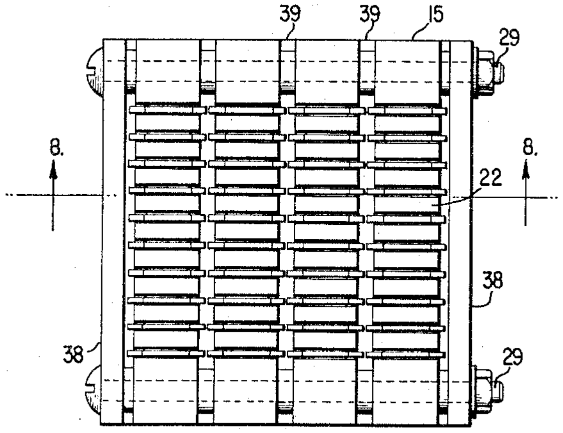
FIG. 7 illustrates the assembly of a number of units as in FIG. 1 to form an assembly of circuit board interconnections for a composite circuit.
Figure 6:
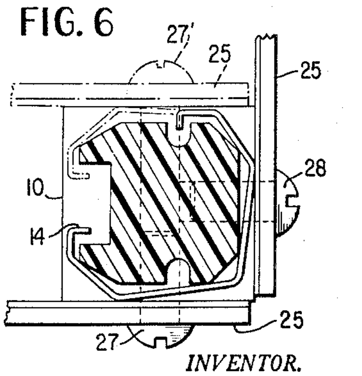
FIG. 6 illustrates the attachment of circuit boards on adjacent faces of the block of FIG. 5.

In FIG. 3, there is illustrated a circuit board 25 having connecting elements 26 on one side thereof, two such boards being attached to the block 10 by means of screws 27 and $27^1$, engaging bore 23. As shown in FIG. 6, one board 25 is secured to the block by means of a screw 28 engaging bore 24, while one or two others are at right angles thereto secured by screws as at 27. As shown in FIG. 7, the block 15 has similar bores receiving through bolts 29 for clamping together a number of blocks 15 between which may be inserted terminal boards. This construction also admits of employment of a terminal board such as 31 having contact strips 26 on one side and additional contacts 32 on the other side thereof.

It likewise permits the use in the same slot of a pair of thinner circuit boards such as 33 and 34 each with a set of contacts on one surface thereof as at 35 and 56. The circuit boards 33 and 34 might, for example, be representative of a pair of plastic cables each having a plurality of conductors along one side thereof, the two plastic cables being inserted back-to-back in the same slot where it might be desired to connect a terminal board such as 31 to a sheet cable such as 33.

Figure 8:
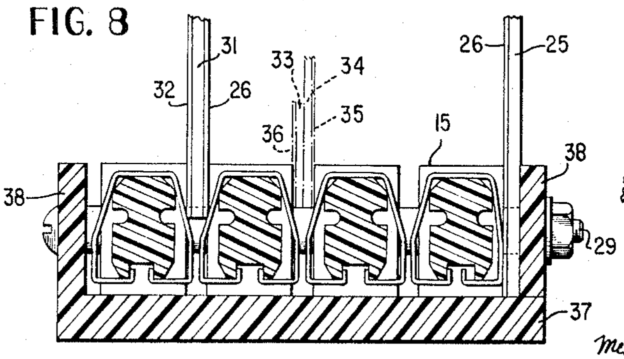
FIG. 8 is a cross-section of a device as in FIG. 7, taken along the line 8—8.

As shown in FIGS. 7 and 8 a group of connectors may be assembled together on a common base 37 having end plates 38 perpendicular thereto and suitably spaced apart to permit the assembly therebetween of a group of blocks 10 or blocks of the thinner form 15, each separated by spacers 39 and held together by through bolts 29. In an assembly such as in FIG. 7 it is convenient to employ the thinner form of insulator block 15 rather than the square form 10 illustrated in FIG. 1 since the necessity to conserve space may outweigh the desirability for the universal form of block.

The contacting element of the connector of this invention resides in a spring of form 11 or 12, or some variation thereof, one spring contact element being inserted in each channel 21. Channels 21 are preferably of square section to receive springs 11 or 12 formed of spring contact material generally of rectangular cross section. The spring elements may be of Phosphor bronze or other suitable non-corroding material and are preferably gold-plated to provide certainty of contact with conductors 26 on the printed circuit boards adapted to be interconnected thereto. Spring elements 11 and 12 are preferably of a width slightly less than the width of channels 21, providing only sufficient clearance between the spring elements and the channel walls to allow free movement of the spring elements.

Figure 2:
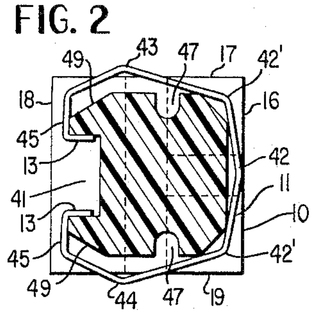
FIG. 2 is a cross-section of the connector of FIG. 1, taken along the line 2—2 of FIG. 1.

A spring 11 of the form shown in FIG. 2, while generally of U-shape, extends to nearly a position from which the ends thereof may join, except that these ends are inwardly turned to form hook elements as at 13 to engage recess 41 formed in one side of the block 10. While various forms of spring element may be employed in the channels 21, a simple and convenient form is made of flat wire bent slightly at the center as at 42 and further bent at 42′ to form divergent lateral walls of a U-spring, biased to provide contact portions 43 and 44 which extend exteriorly of the channel 21, at the lateral faces when the portion 42 is within the channel on the face opposite to recess 41. Contact portions 43 and 44 are formed by providing additional slight bends in the spring elements thereat preferably closer to the surface of the block 10 adjacent to the recess 41 to provide a longer spring action between the contact portions 43 and 44 and the base of the U at 42. Spring 11 has additional bends providing a pair of parallel portions 45 at either end thereof, the extreme end portions being bent essentially at right angles thereto as shown at 13 to provide hook elements for engaging the walls of the recess 41. A spring 11 so constructed is biased outwardly holding contact portions 43 and 44 exteriorly of the channels, the hook portions 13 serving to retain the spring within the channel except at contact points 43 and 44.

The base of channel 21 is provided with recess or well 41 in one face thereof opposite the bend 42 to receive the turned-in ends 13 of spring 11. Although the well 41 is shown as a single well it might be two separate recesses of the form shown at 47, each to receive one end 13 of spring 11. The form of the recess 41 or 47 is not critical but should provide for the receipt and retention of the spring end and permit hook portions 13 to be moved laterally therein as portions 43 and 44 are depressed into channels 21.

The channel base is preferably provided with a relieved portion at each corner thereof shown at 48 and 49 such as to receive a narrower based spring 11 between points 42′, 42′ thereof inasmuch as the upper and lower branches of spring 11 are flared outwardly from the bends 42′. The relieved portions 49 provide for a reception of inwardly flared portions of the spring between parallel portions 45 and the contact protrusions 43 and 44, the relieved portions of the channel bottom at 49 being of sufficient extent to permit depressing contact portions 43 and 44 entirely within the channel as the spring is bent near the center thereof.

A spring of the form shown at 12 has a central bend at 51 forming the base of a generally V-shaped portion which is further bent at 52 on either side to form parallel portions 53, completing a generally U-shaped structure. Beyond the parallel portions 53 the spring 12 is bent additionally to conform to the direction of the channel 21 in two adjacent faces 54 and 55 of the block 10, said faces being opposite a base portion 51 of the spring 12. Spring portions 56 and 57 are generally parallel to faces 54 and 55 and serve partially to retain the spring 12 within the channel 21. Turned-in portions 14 are provided to engage walls of the recesses 41 and 47, respectively. By this means, spring 12 is retained within the channel 21 and may be biased to provide protruding portions 52 on adjacent faces 58 and 59 of the block 10. When constructed in this fashion, the spring 12 is adapted to interconnect contact elements 26 of two printed circuit boards attached to the base 10 by bolts 27 and 28.

As shown in FIG. 6, securing of the circuit boards 25 to faces 58 and 59 depresses spring 12 in identical fashion as the depression of spring 11 illustrated by the securing of circuit boards 25 to the block 10 by the bolts 27 and 27′. It is further noted that either of the relieved portions 48 in the base of the channel 21 can accommodate a portion 53 of spring 12 in generally the same manner as the relieved portion 49 receives the inwardly turned portions of spring 11 beyond contact portions 43 and 44 of FIG. 3. Thus, the relieved portion at the base of the channel serves different purposes, depending upon the spring employed. For this reason, the cross sectional form of block 10 shown at the base of the channel has a generally octagonal form into three adjacent faces of which there are formed recessed or well portions 41 and 47.

Figure 5:
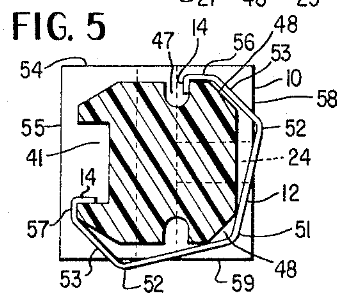
FIG. 5 shows a cross-section of the connector of FIG. 4 taken along the line 5—5.

In order that each block may be completely universal for each form of connector, it is made symmetrical having a recess or well 47 on each face adjacent to face 55. Thus a spring of the form 12 may be inserted as shown in FIG. 5 having portion 57 at face 55 adjacent well 41 and portion 56 at face 54 adjacent well 47, or the portion 57 may be placed at face 59 of the block and the portion 56 at face 55 in the same manner as portion 57 as shown in FIG. 5. Thus, one spring 12 may adapt one portion of block 10 to receive a panel 25 at the lower side of block 10, and another at the right side as shown in FIG. 6 for interconnecting portions thereof. Another spring 12 may be inserted in the channel 21 to interconnect a circuit board on the upper face 54 with one on the face 58 so that the same block 10 may be employed to interconnect two parallel panels for some contact positions thereof and either of these panels with a third panel in other contact positions thereof. Likewise, the spring of the form 11 may be employed interchangeably with a spring of the form 12 and two panels may thus be arranged in parallel relation for certain contact positions therebetween, while either such panel may be connected in other contact positions thereon to a third panel at right angles thereto.

In a device according to FIG. 7 or FIG. 8, a number of blocks 15 may be placed in position to receive parallel circuit boards, displaced by very narrow separation from each other, yet providing firm holding means for the circuit boards. A device manufactured as here disclosed may consist of an insulating block 10 or 15 of any desired length, but is conveniently manufactured in size very much smaller than illustrated. For example, the block 15 may have cross sectional dimensions of ¼ and ⅜ inch, respectively, while the cross sectional dimension illustrated in FIG. 2 might be ⅜ inch. When so constructed, it will be appreciated that circuit boards which are to be interconnected by means of the connector of this invention may be very closely spaced between the terminals on any such strip or board. It is thus readily possible to provide thirty double connections per square inch of surface occupied by the assembly of FIG. 7. In the event dual surfaces are exposed in each slot as when employing printed circuits such as 31 or 33 and 34, the number of connections is of course doubled. It will be appreciated that this is too close a spacing to permit soldered connections, there being insufficient room to permit assembly or disassembly of the boards under ordinary circumstances.

The assembly as in FIG. 7 permits inserting circuit boards in the several slots and thereafter securing them together by tightening bolts 29 when a rigid assembly is required. For this purpose, spacers 39 may be of slightly smaller thickness than the thickness of the circuit boards and one end 38 of the assembly may be detachable from the base 37 in order to provide for adjustable take up to firmly clamp the boards in position between the faces of the block 15.

It will be appreciated by those familiar with printed circuit connector boards that an efficient and compact connector is achieved by the construction herein described and that use of spring elements 11 and 12, interchangeably on a symmetrical block 10, provides a universal base structure for making connections of many kinds and for assembling circuit boards in various configurations mutually parallel or perpendicular to each other. Any desired degree of pressure between circuit boards and blocks may be assured. At the same time, a structure is provided in which the channels protectively receive therein spring members 11 and 12, extending slightly beyond the lateral faces where contact is desired with the terminal board. Upon assembly of the terminal boards against such faces, the springs are depressed within the channel so as to accommodate lost motion of the hooked ends thereof within the recesses or wells 41 or 47 in a manner to prevent any overstressing of the spring as it is depressed. It will be seen that circuit boards may be reassembled in this way any number of times, employing the same connectors, without in any manner causing deterioration of the spring members themselves. Such a construction makes it impossible to damage the spring contact elements by overpressure, and an improved reliability is obtained.

While the invention has been described with respect to particular embodiments it is obvious that many modifications and variations are possible in the light of the above teachings. It is therefore to be understood that within the scope of the appended claims the invention may be practiced otherwise than as specifically described.

What is claimed is:

1. A connector for a plurality of printed circuit strips arranged in linear array comprising
   an elongated block of insulation material of generally square cross section,
   plural transverse channels each formed within the faces of said block and extending therearound between lands thereof, and
   contact spring retaining means including at least a pair of recessed wells formed in the bottom of each said channel,
      each said well extending toward the center of the block,
      each said well being constructed to receive a contact spring turned thereinto after passing around more than three sides of the block in said channel,
      said wells being of sufficient width to permit lost motion of a spring as it is depressed into said channel at an adjacent side of the block,
      one said well of at least one said channel being constructed to permit said motion for terminations at both ends of a said contact spring extending substantially around said block.

2. A printed circuit connector comprising
   an elongated body of insulating material of rectangular section having plural contact faces,
   said body having peripheral channels extending transversely therearound between lands of said faces, including one said channel for each circuit connector position,
   a recess within the bottom of each channel in each of two adjacent said faces, said recesses having lateral wall portions one of which is spaced a predetermined distance from an adjacent contact face,
   a contact spring extending around substantially three sides of said body within each said channel and formed with inwardly turned ends each loosely fitting within one said recess to retain said spring in the channel, each contact spring being formed to include spring contact portions which extend exteriorly of said channel at said contact faces,
   a circuit board for each of two said contact faces, said circuit boards including surface contact elements, one for each connection to be made, means for attaching said circuit boards to said contact faces to cause said springs to be depressed below said lands and within said channels, respectively, to maintain contact pressure on said elements.

3. A printed circuit board connector comprising
   an elongated insulating body of rectangular cross section having a plurality of circuit board contact faces,
   a circuit board secured to each of two said faces, each said board having surface conductor elements spaced along an edge thereof adjacent one said face,
   a plurality of channels peripherally about said body within said faces including at least one recess at the bottom thereof to loosely receive contact spring terminations, said channels being arranged along said body adjacent said conductor elements,
   a contact spring in each of a plurality of said channels having a protruding contact portion for each of said two faces, each spring having a pair of hooked ends each inwardly turned to engage one said recess peripherally beyond said two faces,
   each said recess extending inwardly to receive said end and laterally to permit lateral motion thereof, as a said board is secured to a corresponding said face,
   and said contact springs being formed to be thereby depressed at said contact portions, each to interconnect a pair of corresponding said portions of said circuit boards.

4. A circuit board connector comprising
   an elongated insulator block of substantially square section,
   a plurality of rectangular channels each extending continuously around at least three sides of said block,
   a plurality of recesses in the inner surface of each said channel at adjacet lateral sides thereof,
   a spring contact element in each said channel having inwardly turned ends,
   said elements extending in said channels around substantially three sides of said block,
   said inwardly turned ends loosely engaging recesses to retain said springs therein,
   said springs having plural contact portions extending exteriorly of said channels on two sides of said block,
   and said recesses being of sufficient lateral extent to allow depression of said contact portions entirely within said channels.

5. The connector of claim 4 wherein said channels extend around substantially four sides of said block.

6. The connector of claim 4 wherein said recesses are in three adjacent sides of said block, and said spring elements engage recesses selectively within any two said adjacent sides.

7. A circuit board connector comprising
an elongated insulator block of rectangular section,
a plurality of channels extending substantially around said block,
a spring contact element in each said channel having inwardly turned ends, said spring elements extending around at least parts of three sides of said block,
recess means within each said channel loosely engaging said ends to prevent dislodgment of said spring therefrom,
said spring elements each having two outwardly biased contact portions extending, when not in contact with a said circuit board, exteriorly of said channels,
and said recess means being constructed to permit depressing said contact portions within said channel upon contact with a said board.

8. The connector of claim 7 having at least one said spring element extending around three sides of said block with said recess means in a fourth side thereof.

9. The connector of claim 7 having at least one said spring element extending around two sides of said block with said recess means in said third and fourth sides thereof.

10. The connector of claim 9 having at least one said spring element extending around three sides of said block with said recess means in a fourth side thereof, others thereof being arranged to contact circuit boards disposed at right angles, at least one said spring element being arranged to contact parallel spaced circuit boards.

11. A plurality of connectors according to claim 7 arranged in juxtaposition,
having adjacent sides thereof equipped with said contact portions, whereby a circuit board inserted therebetween is contacted by said portions of a pair of said connectors.

12. A pair of connectors according to claim 7 adjacently arranged for mutual connection to a said circuit board, and clamping means securing at least one said circuit board between said connectors.

13. In a circuit board interconnector having lateral surfaces for contacting a plurality of circuit boards, an insulating body of substantially square transverse section, a plurality of transverse channels extending substantially around said body, separated by lands extending to form said section, said channels having roughly square cross sections parallel to said transverse section between said lands, recess means in two adjacent bottom portions of each said channel to receive and retain inwardly turned spring ends therein, spring contact means in each said channel extending around at least three-quarters of the length of each said channel, each contact means having an inwardly turned end loosely within a said recess means, and a contact portion extending normally exteriorly of said channel on two faces of said body, said portion being proportioned for inward movement within the channel as a surface is pressed against said lands.

References Cited in the file of this patent

UNITED STATES PATENTS

| | | |
|---|---|---|
| 2,699,534 | Klostermann | Jan. 11, 1955 |
| 2,832,942 | French | Apr. 29, 1958 |
| 2,870,424 | Franz | Jan. 20, 1959 |
| 2,942,229 | Berger | June 21, 1960 |
| 2,944,121 | Wasylenko | July 5, 1960 |